United States Patent
Mandai et al.

(10) Patent No.: US 6,815,046 B2
(45) Date of Patent: *Nov. 9, 2004

(54) METHOD OF PRODUCING CERAMIC MULTILAYER SUBSTRATE

(75) Inventors: Harufumi Mandai, Takatsuki (JP); Norio Sakai, Moriyama (JP); Isao Kato, Shiga-ken (JP); Atsushi Kumano, Shiga-ken (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/454,481

(22) Filed: Jun. 5, 2003

(65) Prior Publication Data

US 2003/0211302 A1 Nov. 13, 2003

Related U.S. Application Data

(62) Division of application No. 10/123,162, filed on Apr. 17, 2002, which is a division of application No. 09/504,919, filed on Feb. 16, 2000, now Pat. No. 6,432,239.

(30) Foreign Application Priority Data

| Mar. 3, 1999 | (JP) | ............................................. 11-55582 |
| Oct. 28, 1999 | (JP) | ........................................... 11-307083 |

(51) Int. Cl.[7] ................................................ B32B 3/00
(52) U.S. Cl. ....................... 428/210; 428/212; 428/213; 428/214; 174/259; 361/795
(58) Field of Search .................................. 428/210, 901

(56) References Cited

U.S. PATENT DOCUMENTS

| 5,055,966 A | 10/1991 | Smith et al. |
| 5,085,720 A | 2/1992 | Mikeska et al. |
| 5,102,720 A | 4/1992 | Raj |
| 5,277,724 A | * 1/1994 | Prabhu .................... 156/89.16 |
| 5,370,759 A | 12/1994 | Hakotani et al. |
| 5,387,474 A | 2/1995 | Mikeska et al. |
| 5,456,778 A | 10/1995 | Fukuta et al. |
| 5,474,741 A | 12/1995 | Mikeska et al. |

(List continued on next page.)

FOREIGN PATENT DOCUMENTS

| EP | 0 954 209 A1 | 11/1999 |
| JP | 4-243978 | 9/1992 |
| JP | 5-167253 | 7/1993 |
| JP | 5-308193 | 11/1993 |
| JP | 6-61649 | 3/1994 |
| WO | WO 98/16383 | 4/1998 |

OTHER PUBLICATIONS

Copy of Japanese Examination Report dated Feb. 3, 2004 (and English translation of same).

Primary Examiner—Cathy Lam
(74) Attorney, Agent, or Firm—Dickstein, Shapiro, Morin & Oshinsky, LLP.

(57) ABSTRACT

There is disclosed a method of producing a ceramic multilayer substrate by laminating a plurality of glass-ceramic green sheets made of a glass-ceramic containing an organic binder and a plasticizer to form a laminate; and firing the laminate; further comprising: applying to or overlaying on the surfaces of the glass-ceramic green sheets inorganic compositions, the sintering temperature of the inorganic compositions being higher than that of the glass-ceramic green sheets; laminating a plurality of the glass-ceramic green sheets having the inorganic compositions applied to or overlaid on the surfaces of the glass-ceramic green sheets respectively, to form a part of the laminate; and laminating a plurality of the glass-ceramic green sheets to form the other part of the laminate.

19 Claims, 9 Drawing Sheets

U.S. PATENT DOCUMENTS

| | | | |
|---|---|---|---|
| 5,581,876 A | * | 12/1996 | Prabhu et al. ............... 29/851 |
| 5,601,672 A | | 2/1997 | Casey et al. |
| 5,662,755 A | | 9/1997 | Miura et al. |
| 5,708,570 A | | 1/1998 | Polinski, Sr. |
| 5,814,366 A | | 9/1998 | Fukuta et al. |
| 5,855,711 A | | 1/1999 | Araki et al. |
| 5,858,145 A | * | 1/1999 | Sreeram et al. ......... 156/89.16 |
| 5,866,240 A | * | 2/1999 | Prabhu et al. .............. 428/210 |
| 5,876,536 A | * | 3/1999 | Kumar et al. ........... 156/89.11 |
| 6,139,666 A | | 10/2000 | Fasano et al. |
| 6,177,184 B1 | | 1/2001 | Casey et al. |
| 6,228,196 B1 | | 5/2001 | Sakamoto et al. |
| 6,258,192 B1 | | 7/2001 | Natarajan |
| 6,306,511 B1 | | 10/2001 | Nakao et al. |
| 6,337,123 B1 | * | 1/2002 | Ryugo et al. ............... 428/210 |
| 6,350,334 B1 | | 2/2002 | Shigemi et al. |
| 6,395,118 B1 | | 5/2002 | Sakamoto et al. |
| 6,432,239 B1 | | 8/2002 | Mandai et al. |
| 6,468,640 B2 | * | 10/2002 | Nishide et al. ............. 428/210 |
| 2002/0155264 A1 | | 10/2002 | Nishide et al. |
| 2002/0166694 A1 | | 11/2002 | Nishide et al. |

* cited by examiner

METHOD OF PRODUCING CERAMIC MULTILAYER SUBSTRATE

CROSS REFERENCE TO RELATED APPLICATION

This is a divisional of U.S. patent application Ser. No. 10/123,162, filed on Apr. 17th 2002, which has been allowed. Furthermore, Ser. No. 10/123,162 is a divisional of Ser. No. 09/504,919, filed on Feb. 16th 2000, now U.S. Pat. No. 6,432,239.

BACKGROUND OF THE INVENTION

1. Field of the Invention

The present invention relates to a method of producing a ceramic multilayer substrate on which semiconductor LSI, a chip components, or the like are mounted and wired to each other.

2. Description of the Related Art

Japanese Unexamined Patent Publication No. 5-102666 discloses a conventional method of producing a ceramic multilayer substrate. According to this production method, as shown in FIG. 1, plural glass-ceramic green sheets made of a glass-ceramic, containing an organic binder and a plasticizer, and having a conductor pattern (not illustrated) formed on the surfaces thereof by use of a conductor paste composition are first laminated to form a laminate 101. Next, ceramic green sheets 102 and 103 containing as a major component an inorganic composition having a sintering temperature higher than that of the glass-ceramic green sheet 101 are formed on the back and front sides of the laminate 101, respectively, and thereafter, pressure-bonded together to form a lamination pressure-bonding body 100. Next, the lamination pressure-bonding body 100 is fired under the firing conditions for the laminate 101. Thereafter, the unsintered ceramic green sheets 102 and 103 are removed, whereby a ceramic multilayer substrate is obtained. The laminate 101 is inhibited from heat shrinking in the plane direction at firing, owing to the ceramic green sheets 102 and 103 of the lamination pressure-bonding body 100.

Such a conventional method of producing a ceramic multilayer substrate has the following problems.

When the number of the laminated glass-ceramic green sheets becomes large, and the thickness of the laminate 101 is increased, the vicinities of the ceramic green sheets 102 and 103, that is, the vicinities of the front and back sides of the laminate 101 are inhibited from heat shrinking in the plane direction. However, there have been some cases that the central portion 104 in the thickness direction of the laminate 101 is distorted so as to be depressed toward the inside thereof as shown in FIG. 2. There has been a danger that such distortion 104' causes the inside of the laminate 101 to because cracked and the glass-ceramic green sheets to peel away from each other.

In the case that a cavity for accommodating an electronic component, not illustrated, is formed in the laminate 101, it has been difficult to provide a ceramic green sheet for inhibiting heat shrinkage on the bottom of the cavity.

SUMMARY OF THE INVENTION

To overcome the above described problems, preferred embodiments of the present invention provides a method of producing a ceramic multilayer substrate in which the side faces of the laminate can be prevented from being distorted so as to be depressed toward the inside thereof, caused by the heat shrinkage at firing. In addition, it is an object of the present invention to provide a method of producing a ceramic multilayer substrate in which an inorganic composition for inhibiting the heat shrinkage can be easily provided on the bottom of a cavity in the laminate.

One preferred embodiment of the present invention provides a method of producing a ceramic multilayer substrate by lamination of plural glass-ceramic green sheets made of a glass-ceramic containing an organic binder and a plasticizer to form a laminate, and firing of the laminate comprises the step of applying to or overlaying on the surfaces of the glass-ceramic green sheets inorganic compositions having a higher sintering temperature than the glass-ceramic green sheets, the step of laminating a plurality of the glass-ceramic green sheets having the inorganic compositions applied to or overlaid on the surfaces of the glass-ceramic green sheets to form a part of the laminate, and the step of laminating a plurality of the glass-ceramic green sheets to form the other part of the laminate.

The above described method may include the step of forming one of the glass-ceramic green sheets so as to have a smaller thickness than each of the other glass-ceramic green sheets, the step of applying to or overlaying on the surface of the glass-ceramic green sheet having a smaller thickness the inorganic composition, the step of arranging the glass-ceramic green sheet having a smaller thickness as the undermost layer of the laminate, and the step of laminating a plurality of the glass-ceramic green sheets having the inorganic compositions applied to or overlaid on the surfaces thereof, whereby a part of or the whole of the laminate ranging from the vicinity of the undermost layer to the uppermost layer is formed.

The above described method may include the step of laminating a plurality of the glass-ceramic green sheets having the inorganic compositions provided on the surfaces thereof, whereby a part of or the whole of the laminate ranging from the undermost layer to the vicinity of the uppermost layer is formed, and the step of laminating the glass-ceramic green sheet as the uppermost layer of the laminate.

Moreover, the method may include the step of forming the glass-ceramic green sheets to constitute the undermost and uppermost layers of the laminate so as to have a smaller thickness than the respective glass-ceramic green sheets to constitute the other layers of the laminate.

Further, the method may include the step of forming opening portions through a plurality of the glass-ceramic green sheets arranged as the uppermost layer of the laminate and in its vicinities and also the inorganic compositions applied to or overlaid on the glass-ceramic green sheets, and the step of laminating a plurality of the glass-ceramic green sheets having the opening portions formed therein to form the laminate having a cavity formed of the opening portions of the plural glass-ceramic green sheets which are made continuous to each other.

In the above described method, the inorganic compositions applied to or overlaid on the glass-ceramic green sheets may contain alumina as a major component.

Further, each of the inorganic compositions applied to or overlaid on the glass-ceramic green sheets may have a thickness of from about 1 to 20 $\mu$m.

Furthermore, the differences between the sintering temperatures of the glass-ceramic green sheets and the sintering temperatures of the inorganic compositions applied to or overlaid on the glass-ceramic green sheets is at least about 100° C.

Further, the above described method may include the step of forming a glass-ceramic green sheet on a carrier film, and then applying to or overlaying on the glass-ceramic green sheet the inorganic composition to form an inorganic composition layer, the step of forming a perforation through each of the carrier film, the glass-ceramic green sheet and the inorganic composition layer, filling a conductor material into the perforation to produce a viahole, and further forming a conductor pattern on the inorganic composition layer, and the step of releasing the glass-ceramic green sheet having the viahole and the conductor pattern, together with the inorganic composition layer, from the carrier film and laminating the glass-ceramic green sheets with the inorganic composition layers, sequentially.

Further, the method may include the step of applying to or overlaying on a carrier film the inorganic composition to form an inorganic composition layer, and then forming a glass-ceramic green sheet on the inorganic composition layer, the step of forming a perforation through each of the carrier film, the inorganic composition layer and the glass-ceramic green sheet, then filling a conductor material into the perforation to form a viahole, and forming a conductor pattern on the glass-ceramic green sheet, and the step of releasing the glass-ceramic green sheet having the viahole and the conductor pattern, together with the inorganic composition layer, from the carrier film and laminating the glass-ceramic green sheets with the inorganic composition layers sequentially.

Moreover, a glass-ceramic green sheet having a viahole and a conductor pattern and a green sheet having a perforation not filled with a conductor material, corresponding to the viahole and containing the inorganic composition as a major component may be laminated to form a part of the laminate.

According to the method of producing a ceramic multilayer substrate of the present invention, the glass-ceramic green sheets and the inorganic compositions having a higher sintering temperature than the respective glass-ceramic green sheets are alternately arranged to form a laminate, and fired. Owing to the inorganic compositions, the glass-ceramic green sheets constituting not only the undermost and uppermost layers of the laminate but also the internal layers are inhibited from heat shrinking in the plane direction. Accordingly, there is little danger that distortion of the laminate occurs at firing, that is, the side faces of the laminate are distorted so as to be depressed toward the inside. Therefore, the generation of cracks and the peeling of the glass-ceramic green sheets are prevented. The production of a high precision ceramic multilayer substrate is enabled.

By forming the undermost layer of the laminate, or the undermost and uppermost layers thereof with the glass-ceramic green sheets, the sintered glass-ceramics after the laminate is fired can be used as the mounting surfaces of the ceramic multilayer substrate. Accordingly, the mounting surfaces are stable, and the ceramic multilayer substrate can be mounted without fail as compared with the surfaces made of unsintered inorganic compositions.

By forming the glass-ceramic green sheets constituting the undermost or uppermost layer of the laminate or both of them so as to have a smaller thickness than the respective glass-ceramic green sheets constituting the other layers of the laminate, the amount of change caused by heat shrinkage of the respective layers can be made equal to each other. Accordingly, the peeling or the generation of cracks can be prevented from occurring between the glass-ceramic green sheets.

Further, the inorganic composition having a higher sintering temperature than the glass-ceramic green sheet is exposed on the bottom of the cavity formed in the laminate. Accordingly, it is unnecessary to provide an inorganic composition on the bottom of the cavity after the cavity is formed. The bottom of the cavity can be simply protected from heat shrinking at firing.

Since the inorganic compositions having a higher sintering temperature than the respective glass-ceramic green sheets are arranged inside of the laminate, the unsintered inorganic compositions function as a buffering material against vibration, impact and thermal shock. Accordingly, cracks or breaks fatal to the laminate are not generated.

Since the glass-ceramic green sheets constituting the laminate and the inorganic compositions for inhibiting the heat shrinkage at firing have different sintering temperatures, the co-firing of the whole laminate is possible, and the simplification of the manufacturing process and the reduction of the manufacturing cost can be realized.

In the case that the materials for use in the inorganic composition to inhibit the heat shrinkage include no glass, even though the conductor constituting the internal electrodes is diffused was firing of the laminate, caused by the plastic flow of the glass-ceramic green sheets, diffusion can be inhibited owing to the inorganic compositions for inhibiting the heat shrinkage.

Other features and advantages of the present invention will become apparent from the following description of the invention which refers to the accompanying drawings.

DETAILED DESCRIPTION OF PREFERRED EMBODIMENTS

First Embodiment

A method of producing a ceramic multilayer substrate according to a first embodiment of the present invention is described by use of the drawings. In this embodiment, for the inorganic composition layers comprising an inorganic composition having a higher sintering temperature than the respective glass-ceramic green sheets, a paste (slurry) made of an inorganic oxide composition containing alumina as a major component is applied to the surfaces of the respective glass-ceramic green sheets constituting a laminate. Hereinafter, this will be described in the order of formation.

(1) Formation of Glass-Ceramic Green Sheet

Figure 1:
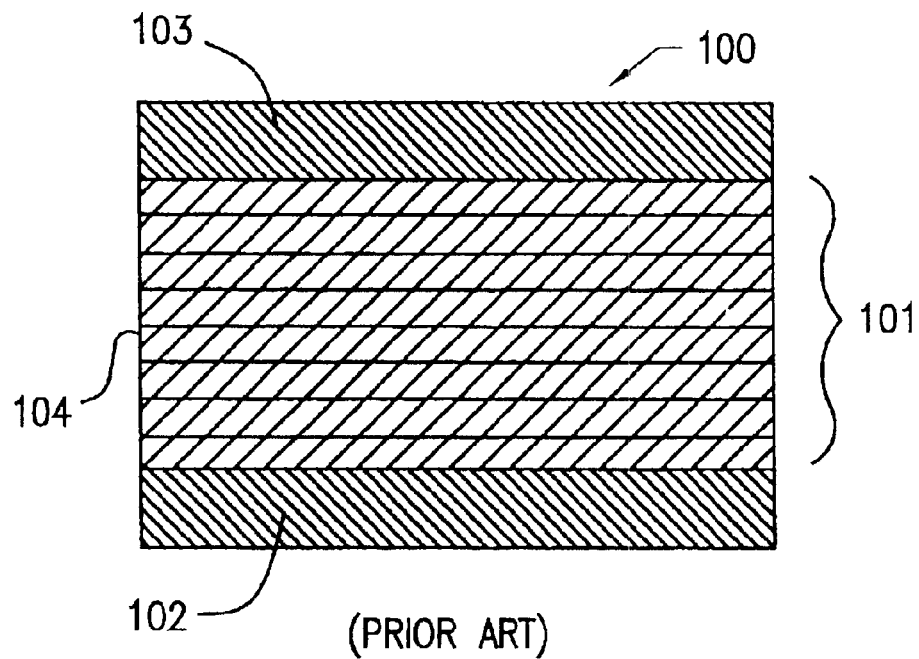
FIG. 1 is a cross section showing a laminate produced by a conventional method of producing a ceramic multilayer substrate.
Figure 2:
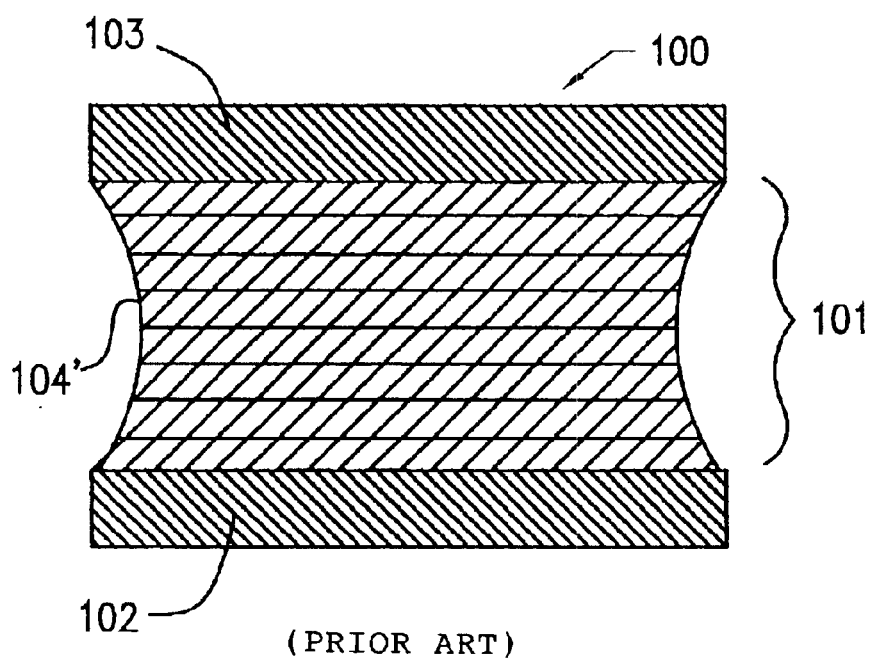
FIG. 2 is a cross section showing the state that the laminate as shown in FIG. 1 is distorted.
Figure 3:
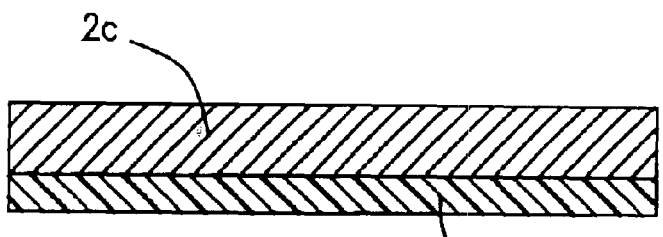
FIG. 3 is a schematic cross section of a glass-ceramic green sheet 2c formed on a carrier film 1 in a first embodiment of the present invention.

First, a glass-ceramic green sheet is formed as follows. A glass-ceramic which consists of a composition comprising lead borosilicate glass powder and alumina powder at a ratio by weight of 50:50 is added to an organic binder comprising polyvinylbutyral, a plasticizer comprising di-n-butylphthalate, and a solvent produced by mixing toluene and isopropyl alcohol at a ratio by weight of 30:70, and mixed to form slurry. Next, the slurry is sheet-formed on a carrier film 1 by the doctor-blade method as shown in FIG. 3, and dried to form a glass-ceramic green sheet 2c.

(2) Formation of Inorganic Composition Layer

Figure 4:
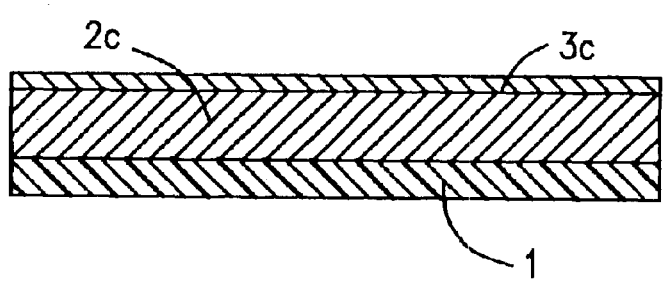
FIG. 4 is a schematic cross section showing an inorganic composition layer 3c further formed in the above embodiment.

As shown in FIG. 4, an inorganic composition layer 3c is formed on the glass-ceramic green sheet 2c which is formed on the carrier film 1. The inorganic composition layer 3c is formed by applying a paste (slurry) to the surface of the glass-ceramic green sheet 2c and drying, the paste being produced by adding alumina powder to an organic binder comprising polyvinylbutyral, a plasticizer comprising di-n-butylphthalate, and a solvent produced by mixing toluene and isopropyl alcohol at a ratio by weight of 30:70, and mixing them.

The alumina has a higher sintering temperature than the glass-ceramic green sheet 2c. The inorganic composition layer 3c containing the alumina as a major component has a higher sintering temperature than the glass-ceramic green sheet 2c. That is, the inorganic composition layer 3c can not be sintered under the sintering conditions for the glass-ceramic green sheet 2c.

Zirconium oxide, aluminum nitride, boron nitride, mullite, magnesium oxide, silicon carbide, or the like, may be substituted for alumina used as a material for the inorganic composition layer 3c.

(3) Formation of Viahole

Figure 5:
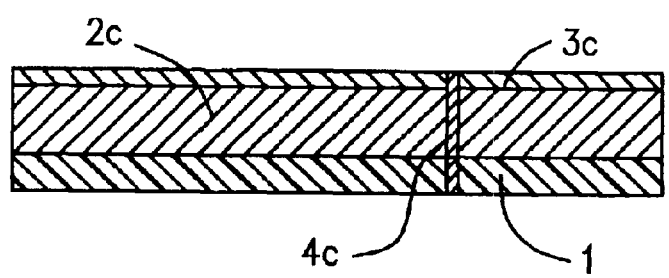
FIG. 5 is a schematic cross section showing a viahole 4c further formed in the above embodiment.

Next, formed are perforations through each of the carrier film 1, the glass-ceramic green sheet 2c and the inorganic composition layer 3c by means of a perforator. Into the perforations, a conductor material (conductor paste) is filled by screen printing or the like, whereby a viahole 4c is formed through the carrier film 1, the glass-ceramic green sheet 2c and the inorganic composition layer 3c, as shown in FIG. 5.

For use as the conductor paste, a vehicle comprising ethyl cellulose as an organic binder dissolved in terpineol is added to an inorganic component comprising 5 weight parts of glass frit and 100 weight parts of silver powder. Powders of copper, silver/palladium or silver/platinum or the like may be substituted for the silver powder used as an inorganic component of the conductor paste.

(4) Formation of Conductor Pattern

Figure 6:
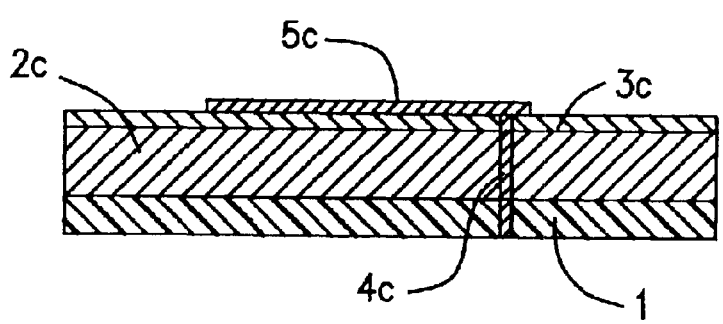
FIG. 6 is a schematic cross section showing a conductor pattern 5c further formed in the above embodiment.

As shown in FIG. 6, a conductor paste is printed on the inorganic composition layer 3c formed on the glass-ceramic green sheet 2c by a screen printing method, whereby a conductor pattern 5c connecting to the viaholes 4c is formed.

The conductor pattern 5c may also be formed by use of metal foil or a metallic wire. In this case, available are a method of hot pressing a punched metal foil or metal wire against a ceramic green sheet, or a method of forming a pattern on a resin film by vapor deposition, sputtering, plating or the like, and heat transferring the pattern onto a ceramic green sheet.

(5) Lamination

Figure 7:
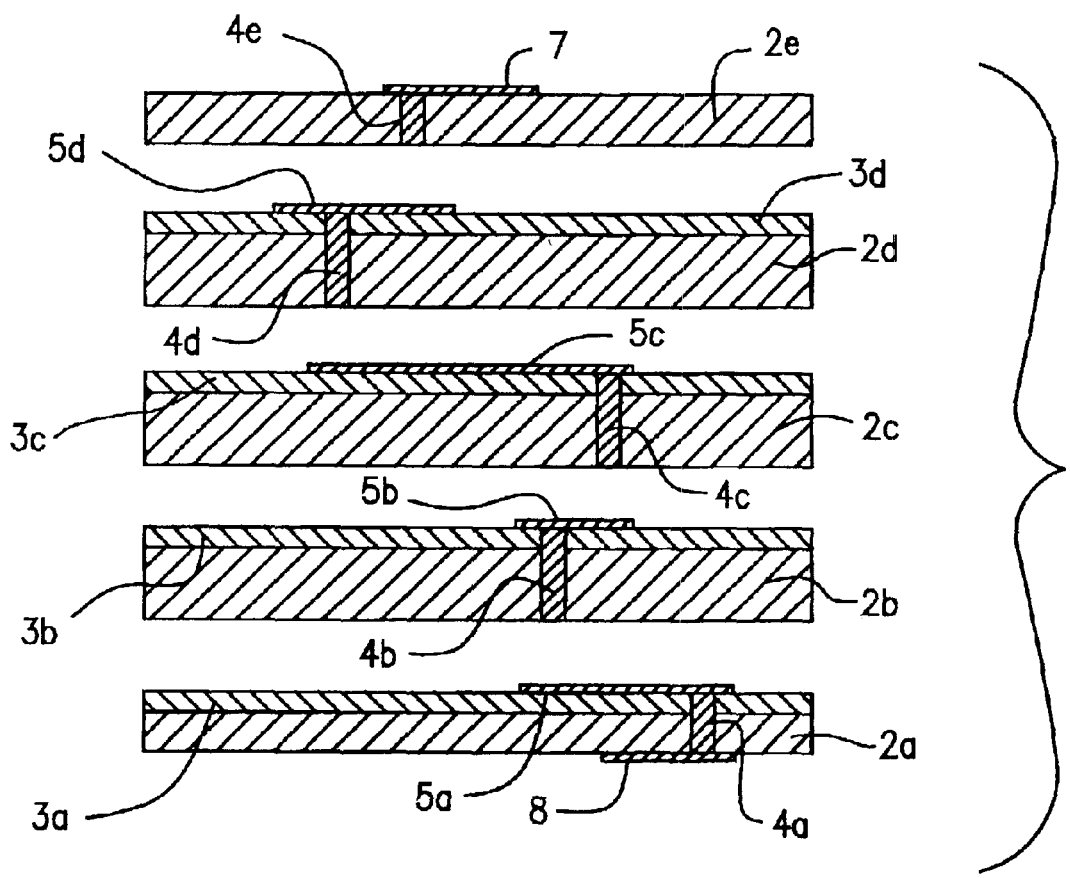
FIG. 7 consists of schematic cross sections showing the state that the respective glass-ceramic green sheets are laminated in the above embodiment.

As shown in FIG. 7, a plurality of the glass-ceramic green sheets 2c formed by the procedures (1) through (4) are peeled from the carrier films 1, respectively. The glass-ceramic green sheets 2c, together with the glass-ceramic green sheets 2a, 2b, 2d prepared by a technique similar to the above-described one, are sequentially laminated, with the surface sides thereof where the inorganic composition layer 3c and the conductor pattern 5c are formed, being on the upper sides thereof.

In glass-ceramic green sheets 2b and 2d, the inorganic composition layers 3b and 3d are formed on one of the main sides thereof, similarly to the glass-ceramic green sheet 2c, viaholes 4b and 4d are formed so as to perforate through the glass-ceramic green sheets 2b and 2d, and the inorganic composition layers 3b and 3d, and conductor patterns 5b and 5d are formed on the surfaces of the surfaces of the inorganic composition layers 3b and 3d, respectively.

The glass-ceramic green sheet 2a constituting the undermost layer of the ceramic multilayer substrate, and the glass-ceramic green sheet 2e constituting the uppermost layer of the ceramic multilayer substrate each have a thickness which is smaller than the glass-ceramic green sheets 2b, 2c, 2d or the like constituting the other layers. Further, as to the glass-ceramic green sheet 2a, after the carrier film is released, a conductor pattern 8 to function as a surface electrode is also formed on the back side thereof where the inorganic composition layer 3a is not provided and a conductor patterns 5a is formed on the front side and the two conductors are interconnected by viahole 4a. The conductor pattern 8 to function as a surface electrode may also be formed by printing the conductor pattern and baking after the ceramic multilayer substrate is fired. The glass-ceramic green sheet 2e constituting the uppermost layer of the ceramic multilayer substrate with a conductor pattern 7 and viahole 4e are formed in compliance with the procedures for producing ordinary glass-ceramic green sheets without the inorganic composition layer being formed thereon.

(6) Pressure-Bonding

The glass-ceramic green sheets 2a through 2e are hot pressure-bonding under the conditions of a temperature of 80° C. and a pressure of 200 kg/cm$^2$, for example, to form a lamination pressure-bonded body. Hereupon, the glass-ceramic green sheets 2a through 2e are bonded to the inorganic composition layers 3a through 3d, owing to the anchor effects and so forth.

Figure 8:
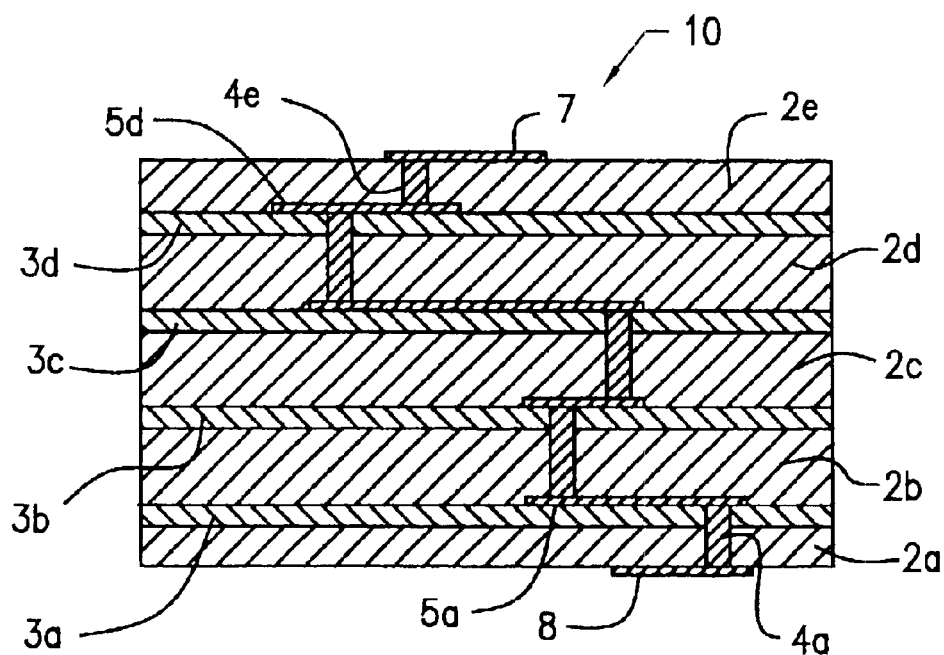
FIG. 8 is a schematic cross section of a lamination pressure-bonding body 10 in the above embodiment.

FIG. 8 shows the lamination pressure-bonded body formed as described above. In this figure, reference numeral 10 designates the lamination pressure-bonded body, in which the glass-ceramic green sheets 2a through 2e and the inorganic composition layers 3a through 3d are alternately arranged, and the conductor patterns 7 and 8 formed on the front and back sides thereof to function as surface electrodes and the conductor patterns 5a through 5d provided between the respective layers to function as internal electrodes are connected to each other through viaholes 4a through 4e.

As to each of the glass-ceramic green sheets 2b through 2d constituting the lamination pressure-bonded body 10, the opposite sides thereof are coated with the inorganic composition layers 3a through 3d. The glass-ceramic green sheet 2a constituting the undermost layer of the lamination pressure-bonded body 10, and the glass-ceramic green sheet 2e constituting the uppermost layer have a smaller thickness than the glass-ceramic green sheets 2b through 2d of the other layers.

(7) Firing

Figure 9:
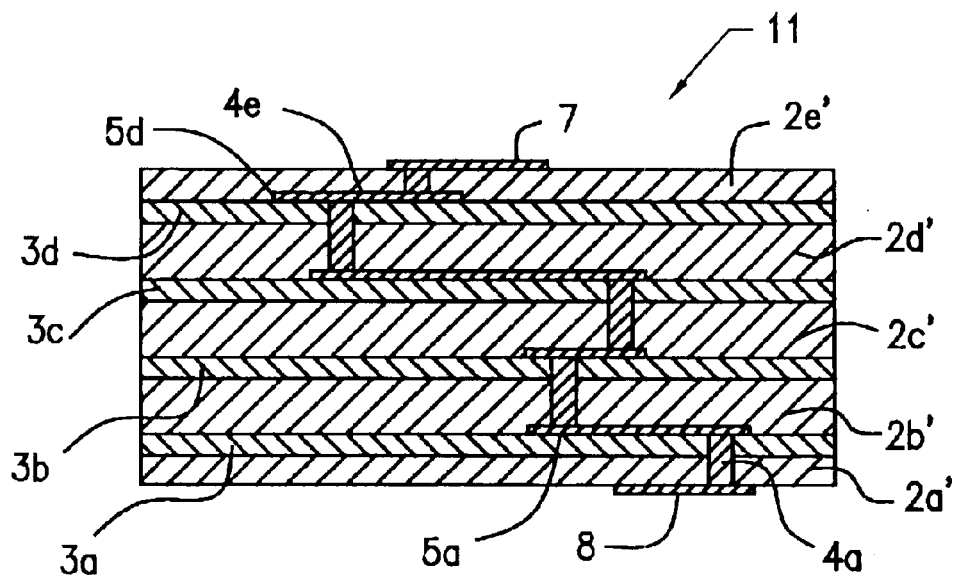
FIG. 9 is a schematic cross section of a sintered body (ceramic multilayer substrate) obtained after the lamination pressure-bonding body is fired.

The lamination pressure-bonded body 10 is fired in the air or in the nitrogen atmosphere under the conditions of a temperature of 900° C. and 1 hour, for example. On this occasion, the glass-ceramic green sheets constituting the lamination pressure-bonded body 10 are allowed to heat-shrink in the x, y, and z directions. However, the glass-ceramic green sheets are "restrained" by the inorganic composition layers 3a through 3d, which are arranged alternately with the glass-ceramic green sheets. Accordingly, as shown in FIG. 9, the heat shrinkage in the plane direction (x-y direction) is restrained, and the green sheets considerably shrunk only in the thickness direction (2 direction). That is, the glass-ceramic green sheets 2a through 2e as shown in FIG. 8 considerably shrink in the thickness direction to become the glass-ceramic bodies 2a' through 2e' in the sintered body (ceramic multilayer substrate) 11 as shown in FIG. 9.

It is speculated that the restraint is brought about as follows. First, the glass components of the glass-ceramic green sheets 2a through 2e are diffused and permeated into the inorganic composition layers 3a through 3d at firing. Thus, the glass-ceramic green sheets 2a through 2e are strongly bonded to the inorganic composition layers 3a through 3d before the glass-ceramic green sheets 2a through 2e substantially start to shrink. Further, at the time when the glass-ceramic green sheets 2a through 2e substantially start to shrink, that is, under the firing conditions of the glass-ceramic green sheets 2a through 2e, the sintering of the inorganic composition layers 3a through 3d does not proceed.

Not only the vicinities of the undermost and uppermost layers of the lamination pressure-bonded body 10, but also the glass-ceramic green sheets 2b through 2d constituting the internal layers, are inhibited from heat shrinking in the plane direction owing to the effects of the inorganic composition layers 3a through 3d. Accordingly, there is no danger that the lamination pressure-bonded body 10 is distorted at firing, especially the side faces thereof being distorted so as to be depressed toward the inside thereof. Accordingly, the generation of cracks and the peeling of the glass-ceramic green sheets 2a through 2e are prevented. Thus, the production of a high precision ceramic multilayer substrate 11 can be produced.

Further, the heat shrinkage restraining degrees of the respective glass-ceramic green sheets 2a and 2e are small compared with the glass-ceramic green sheets 2b, 2c and 2d since for each of the glass-ceramic green sheets 2a and 2e, only one of the main faces thereof is contacted with the inorganic composition layer. However, since the thicknesses of the glass-ceramic green sheets 2a and 2e are smaller than those of the glass-ceramic green sheets 2b, 2c and 2d, respectively, the amount of change caused by the heat shrinkage are small. The thicknesses of the glass-ceramic green sheets 2a and 2e are adjusted so that the amount of change caused by heat shrinkage of the glass-ceramic green sheets 2a and 2e become equal to those of the glass-ceramic green sheets 2b, 2c and 2d. From such a viewpoint, each thickness of the respective glass-ceramic green sheets of the uppermost and undermost layers is about 0.1–0.9 times, preferably about 0.3–0.7 times, that of the other glass-ceramic green sheets.

As described above, the amount of change caused by heat shrinkage in the method of producing a ceramic multilayer substrate according to the first embodiment of the present invention, between the glass-ceramic green sheets 2a and 2b, between the glass-ceramic green sheets 2b and 2c, between the glass-ceramic green sheets 2c and 2d, and between the glass-ceramic green sheets 2d and 2e are essentially equal to each other. Accordingly, a high precision ceramic multilayer substrate can be attained in which peeling between the respective glass-ceramic green sheets and the generation of cracks are prevented, and moreover warp and distortion are reduced.

Figure 10:
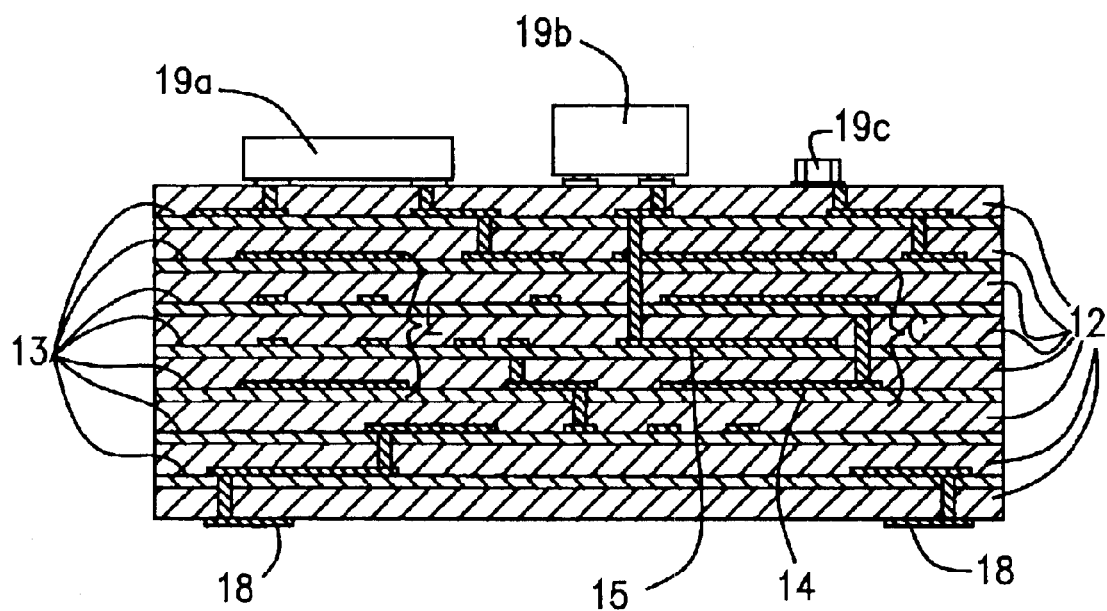
FIG. 10 is a schematic cross section of a ceramic multilayer module 20 according to the present invention.

The ceramic multilayer substrate 11 as shown in FIG. 9 can be used as a substrate for a ceramic multilayer module 20 as shown in FIG. 10, for example. The ceramic multilayer module 20 contains a coil pattern, a capacitor pattern or the like, which is formed by internal electrodes 15, viaholes 14, or the like, and includes a substrate produced by alternately laminating glass-ceramic green sheets 12 and inorganic composition layers 13. On one of the main sides, semiconductor devices 19a and 19b, a chip monolithic capacitor 19c, and so forth are mounted. Land electrodes 18 are formed on the other main side.

The thicknesses of the glass-ceramic green sheets of the uppermost and undermost layers may be substantially equal to those of the other glass-ceramic green sheets in the ceramic multilayer module 20. However, preferably, the thicknesses of the glass-ceramic green sheets as the uppermost and undermost layers are smaller than those of the other glass-ceramic green sheets, similarly to the above-described ceramic multilayer substrate 11.

Second Embodiment

Hereinafter, a method of producing a ceramic multilayer substrate according to a second embodiment of the present invention will be described.

Basically, according to the same points as those of the first embodiment, (1) the formation of glass-ceramic green sheets, (2) the formation of inorganic composition layers, (3) the filling of viaholes and (4) the formation of conductor patterns are carried out, whereby glass-ceramic green sheets 31a through 31h (FIG. 11) having the surfaces coated with the inorganic composition layers are formed.

Opening portions are formed in glass-ceramic green sheets 31e through 31h constituting the uppermost layer of the laminate and its vicinities so as to perforate through the glass-ceramic green sheets and the inorganic composition layers applied to or overlaid on the glass-ceramic green sheets by use of a perforator. The opening portions of the respective glass-ceramic green sheets are formed at positions corresponding to each other. In this embodiment, the opening portions are formed in the centers of the glass-ceramic green sheets.

Figure 11:
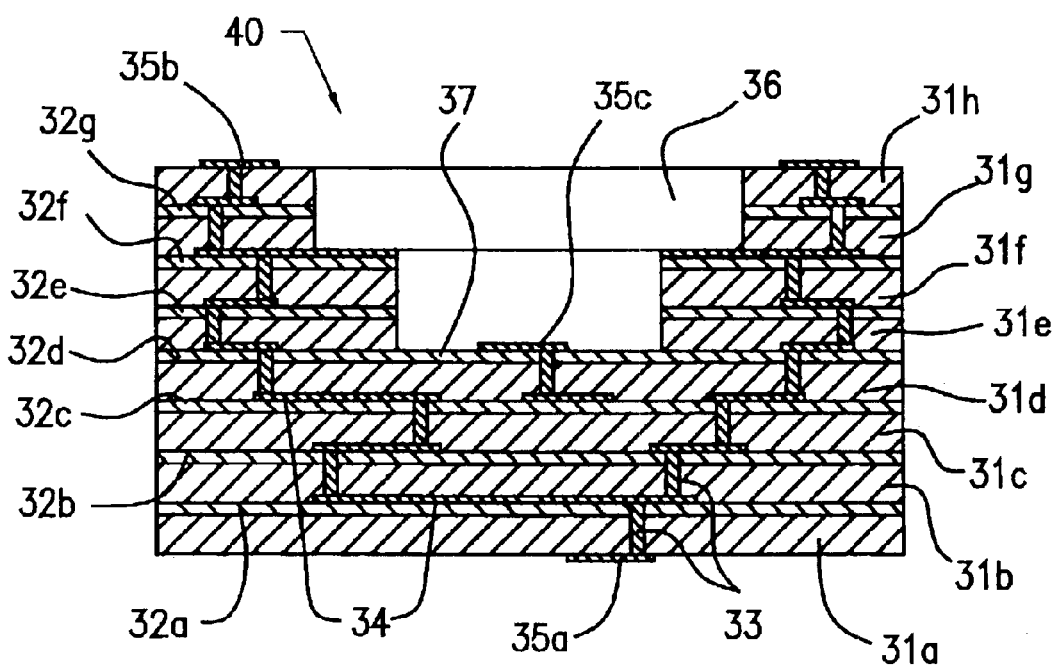
FIG. 11 is a schematic cross section of a ceramic multilayer substrate 40 having a cavity 36 according to a second embodiment of the present invention.

The glass-ceramic green sheets are laminated (5) to form a laminate. FIG. 11 shows the laminate.

In this figure, the laminate 40 has the lamination structure in which the glass-ceramic green sheets 31a through 31h and the inorganic composition layers 32a through 32g are alternately laminated. An external electrode 35a is provided on the surface on the undermost layer side of the laminate 40, and external electrodes 35b are formed on the surface on the uppermost layer side. Further, inside of the laminate 40, a predetermined wiring structure is formed by use of viaholes 33 and internal electrodes 34.

Opening portions are formed in the glass-ceramic green sheets 31e, 31f, 31g and 31h arranged in the uppermost layer of the laminate 40 and its vicinity. The opening portions are made continuous to form a cavity 36. The bottom of the cavity 36 is composed of the glass-ceramic green sheet 31d. The inorganic composition layer 32d provided on the surface of the glass-ceramic green sheet 31d is exposed as the bottom 37 of the cavity 36. A surface electrode 35c is arranged on the inorganic composition layer 32d so as to be connectable to mounted components, not illustrated.

Next, the pressure-bonded (6) of the laminate 40 and firing (7) are carried out. Hereupon, the bottom of the cavity 36 of the laminate 40 is protected from heat shrinking by the inorganic composition layer 32d, similarly to the other layers constituting the laminate 40. Accordingly, the bottom has an excellent flatness.

In this embodiment, as described above, the inorganic composition layer 32d for inhibiting the heat shrinkage at firing is exposed on the bottom of the cavity 36 formed in the laminate 40. Accordingly, it is unnecessary newly to provide a ceramic green sheet or the like on the bottom of the cavity 36 after the cavity 36 is formed, and the bottom of the cavity 36 can be simply protected from heat shrinking at firing. However, it should be noted that the bottom of the cavity 36 may be formed in such a manner that the glass-ceramic green sheet is exposed.

Third Embodiment

Next, a method of producing a ceramic multilayer substrate according to a third embodiment of the present invention will be described.

The method of producing a ceramic multilayer substrate of this embodiment will be described sequentially in the order of the working items by use of the drawings.

(1) Formation of Inorganic Composition Layer

Figure 12:
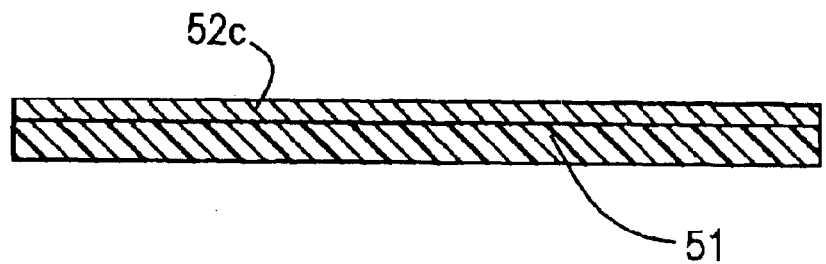
FIG. 12 is a schematic cross section showing an inorganic composition layer 52c formed on a carrier film 51 in the third embodiment of the present invention.

First, a paste (slurry) is prepared by adding alumina powder to an organic binder comprising polyvinylbutyral, a plasticizer comprising di-n-butylphthalate, and a solvent produced by mixing toluene and isopropyl alcohol at a ratio by weight of 30:70, and mixing them. Subsequently, as shown in FIG. 12, with the paste, a sheet is formed on a carrier film 51 by the doctor blade method or the like, and dried whereby an inorganic composition layer (ceramic green sheet) 52c is formed.

The alumina has a higher sintering temperature than the respective glass-ceramic green sheets described later. An inorganic composition layer 52c containing the alumina as a major component has a higher sintering temperature than the respective glass-ceramic green sheets. That is, the inorganic composition layer 52c can not be sintered under the sintering conditions for the glass-ceramic green sheets. Similarly to the above-described case, zirconium oxide, aluminum nitride, boron nitride, mullite, magnesium oxide, silicon carbide or the like can be substituted for alumina used as a material for the inorganic composition layer 52c.

(2) Formation of Glass-Ceramic Green Sheet

Figure 13:
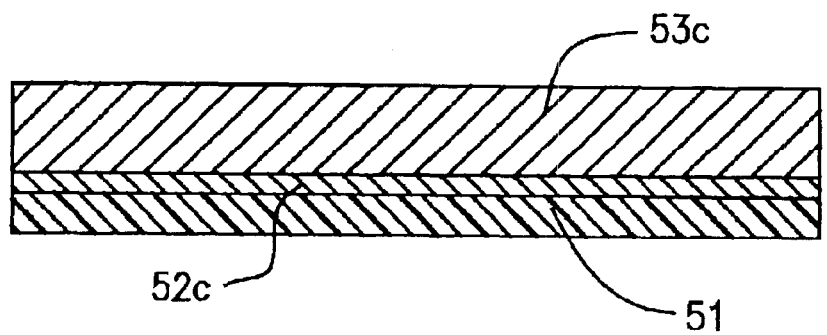
FIG. 13 is a schematic cross section showing a glass-ceramic layer 53c formed in the above embodiment.

As shown in FIG. 13, a glass-ceramic green sheet (glass-ceramic layer) 53c is formed on an inorganic composition layer 52c which is formed on the carrier film 51. The glass-ceramic layer 53c is produced by shaping a slurry on the inorganic composition layer 52c by the doctor blade method, and drying. The slurry is produced by adding to an organic binder comprising polyvinylbutyral or the like, a plasticizer comprising di-n-butylphthalate or the like, and a solvent produced e.g. by mixing toluene and isopropyl alcohol at a ratio by weight of 30:70, a glass-ceramic which is a composition comprising lead borosilicate glass powder and alumina powder at a ratio by weight of 50:50, and mixing them.

(3) Formation of Viahole

Figure 14:
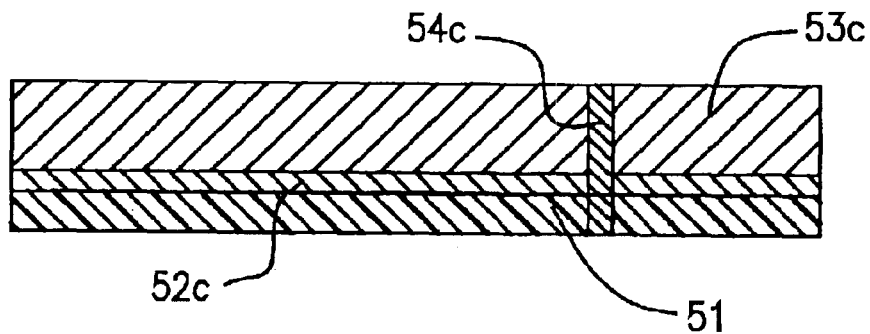
FIG. 14 is a schematic cross section showing viahole 54c further formed in the above embodiment.

Next, formed are perforations through each of the carrier film 51, the inorganic composition layer 52c and the glass-ceramic layer 53c by means of a perforator. Into the perforations, a conductor material (conductor paste) is filled by a screen printing method or the like, whereby a viahole 54c is formed through each of the carrier film 51, the inorganic composition layer 52c and the glass-ceramic layer 53c, as shown in FIG. 14.

Hereupon, for use as the conductor paste, similarly to the above-described case, a vehicle comprising ethyl cellulose as an organic binder dissolved in terpineol is added to an inorganic component comprising 5 parts by weight of glass frit and 100 parts silver powder. Powder of copper, silver/palladium, silver/platinum or the like can be substituted for the silver powder used as an inorganic component of the conductor paste.

(4) Formation of Conductor Pattern

Figure 15:
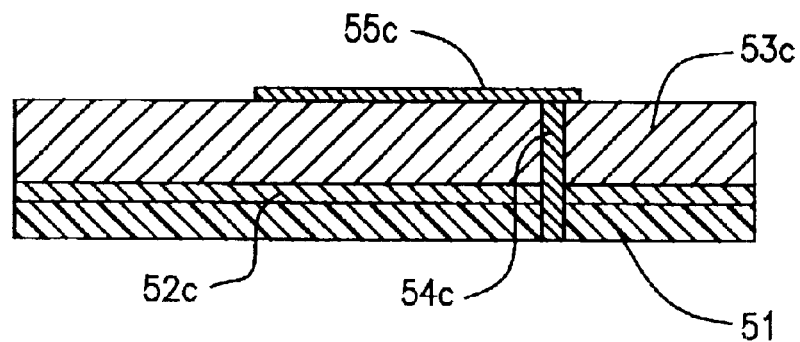
FIG. 15 is a schematic cross section showing a conductor pattern 55c formed in the above embodiment.

As shown in FIG. 15, the glass-ceramic layer 53c formed on the inorganic composition layer 52c is printed with a conductor paste by a screen printing method, whereby a conductor pattern 55c connected to the viahole 54c is formed.

The conductor pattern 55c may be formed by use of metal foil or a metallic wire, similarly to the above-described embodiments. In this case, available are a method of hot pressing a punched metal foil or a metal wire against a ceramic green sheet, or a method of forming a pattern on a resin film by vapor deposition, sputtering, plating, or the like, and heat transferring the pattern onto a ceramic green sheet.

(5) Lamination

Figure 16:
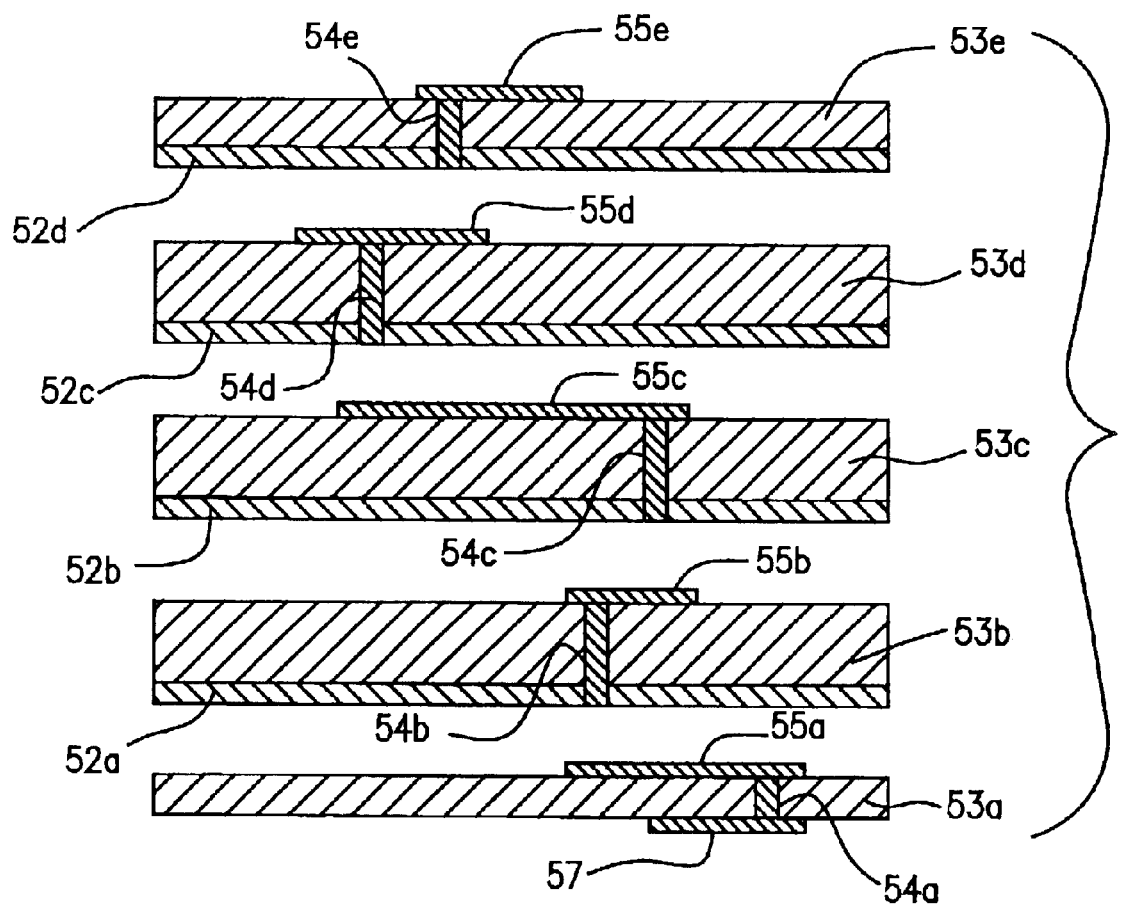
FIG. 16 is a schematic cross section showing the state that the glass-ceramic layers are laminated in the above embodiment.

As shown in FIG. 16, a plurality of the glass-ceramic layer 53c formed by the procedures (1) through (4) are peeled from the carrier films 51, and are laminated sequentially, together with the glass-ceramic layers 53a, 53b, 53d and 53e which are prepared by a technique similar to the above-described one with the surface side thereof where the conductor pattern 55c is formed being the upper side thereof.

That is, the inorganic composition layers 52b, 52d and 52e are formed on the one-side main face of the respective glass-ceramic layers 53b, 53d and 53e, similarly to the glass-ceramic layer 53c. Further, formed are viaholes 54b, 54d and 54e perforating through each of the glass-ceramic layers and the inorganic composition layers, to conductor patterns 55b, 55d and 55e.

The glass-ceramic layer 53a constituting the undermost layer of the ceramic multilayer substrate, and the glass-ceramic layer 53e constituting the uppermost layer of the ceramic multilayer substrate have a smaller thickness as compared with the glass-ceramic layers 53b, 53c and 53d constituting the other layers. Further, the glass-ceramic layer 53a, having no inorganic composition layer formed thereon, is produced in compliance with the preparation procedures for ordinary glass-ceramic green sheets. A conductor pattern 55a to function as an internal electrode and a conductor pattern 57 as an external electrode are printed on the opposite sides and connected by viahole 54a.

(6) Pressure-bonded

The glass-ceramic layer 53a, and the glass-ceramic layers 52b through 53e provided with the inorganic composition layers 52a through 52d are heat pressure-bonded under the conditions of a temperature of 80° C. and a pressure of 200 kg/cm$^2$, for example, to form a lamination pressure-bonded body. Hereupon, the glass-ceramic layers 53a through 53e and the inorganic composition layers 52a through 52d are bonded to each other, attributed to an anchor effect or the like.

Figure 17:
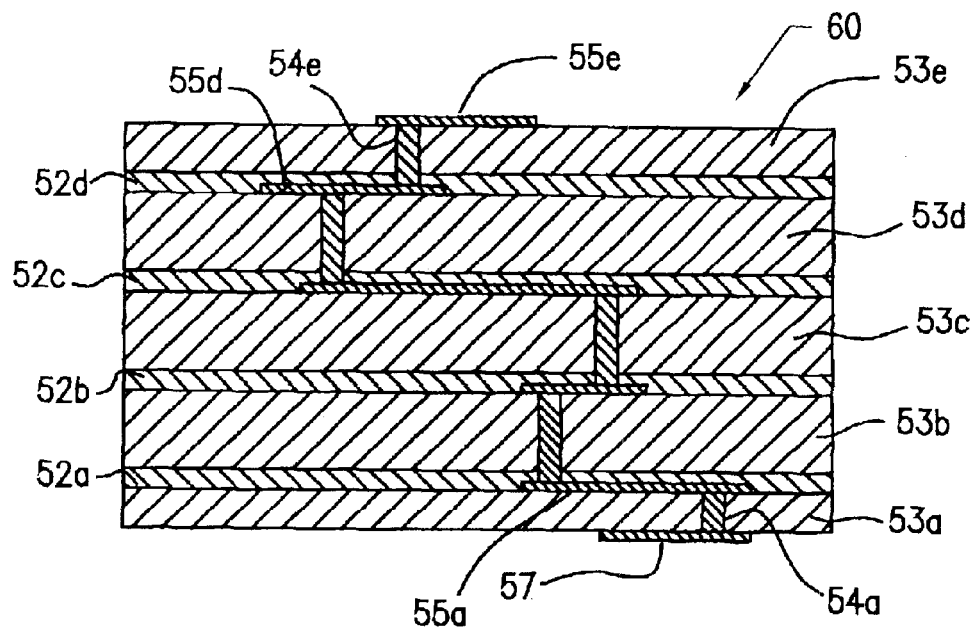
FIG. 17 is a schematic cross section of a lamination pressure-bonding body 60.

FIG. 17 shows a lamination pressure-bonded body formed as described above. In this figure, reference numeral 60 designates the lamination pressure-bonded body in which the glass-ceramic layers 53a through 53e and the inorganic composition layers 52a through 52d are alternately arranged, and conductor patterns 57 and 55e formed on the front side and the back side function as surface electrodes, and the conductor patterns 55a through 55d provided between the respective layers to function as internal electrodes are connected to each other through the viaholes 54a through 54e.

The opposite sides of the respective glass-ceramic layers 53b through 53d constituting the lamination pressure-bonded body 60 are coated with the inorganic composition layers 52a through 52d. Further, the glass-ceramic layer 53a constituting the undermost layer of the lamination pressure-bonded body 60, and the glass-ceramic layer 53e constituting the uppermost layer, have a smaller thickness as compared with the other layers, than is, the glass-ceramic layers 53b through 53d.

(7) Firing

The lamination pressure-bonded body 60 is fired in the air or in a nitrogen atmosphere under the conditions of a temperature of 900° C. and 1 hour, for example. On this occasion, the glass-ceramic layers constituting the lamination pressure-bonded body 60 are about to heat-shrink in the x, y, and z directions, respectively. However, the glass-ceramic layers are "restrained" by the inorganic composition layers 52a through 52d which are arranged alternately with the glass-ceramic layers. Accordingly, the heat shrinkage in the plane direction (x-y direction) is restrained, and the green sheets considerably shrink only in the thickness direction (z direction).

The heat shrinkage in the plane direction is prevented not only in the vicinities of the undermost and uppermost layers of the lamination pressure-bonded body 60 but also in the glass-ceramic layers 53b through 53d constituting the internal layers because of the effects of the inorganic composition layers 52a through 52d. Accordingly, there is no danger that the distortion occurs at firing, and especially, the side faces of the lamination pressure-bonded body 60 being distorted so as to be depressed toward the inside. Accordingly, the generation of cracks and the peeling of the glass-ceramic layers 53a through 53e are prevented. Thus, the production of a high precision ceramic multilayer substrate is enabled.

Further, the heat shrinkage restraining degrees of the respective glass-ceramic layers 53a and 53e are lower as compared with the glass-ceramic layers 53b, 53c and 53d since each of the glass-ceramic layers 53a and 53e is contacted with the inorganic composition layer only on one main side thereof. However, the change caused by the heat shrinkage are small since the thicknesses of the glass-ceramic layers 53a and 53e are smaller than those of the glass-ceramic layers 53b, 53c and 53d, respectively. That is, the thicknesses of the glass-ceramic layers 53a and 53e are adjusted so that the change by heat shrinkage of the glass-ceramic layers 53a and 53e become equal to those of the glass-ceramic layers 53b, 53c and 53d, respectively. From such a viewpoint, each thickness of the glass-ceramic layer of the uppermost or undermost layer, is about 0.1–0.9 times, preferably, about 0.3–0.7 times that of the other glass-ceramic layers.

In the method of producing a ceramic multilayer substrate according to the third embodiment of the present invention, the change caused by heat shrinkage between glass-ceramic layers 53a and 53b, between glass-ceramic layers 53b and 53c, between glass-ceramic layers 53c and 53d, and between glass-ceramic layers 53d and 53e are essentially equal to each other. Accordingly, a high precision ceramic multilayer substrate can be attained in which peeling between the respective glass-ceramic layers, and the deformation and the crack generation by heat shrinkage, are prevented, and warp and distortion are reduced.

Fourth Embodiment

Figure 18:
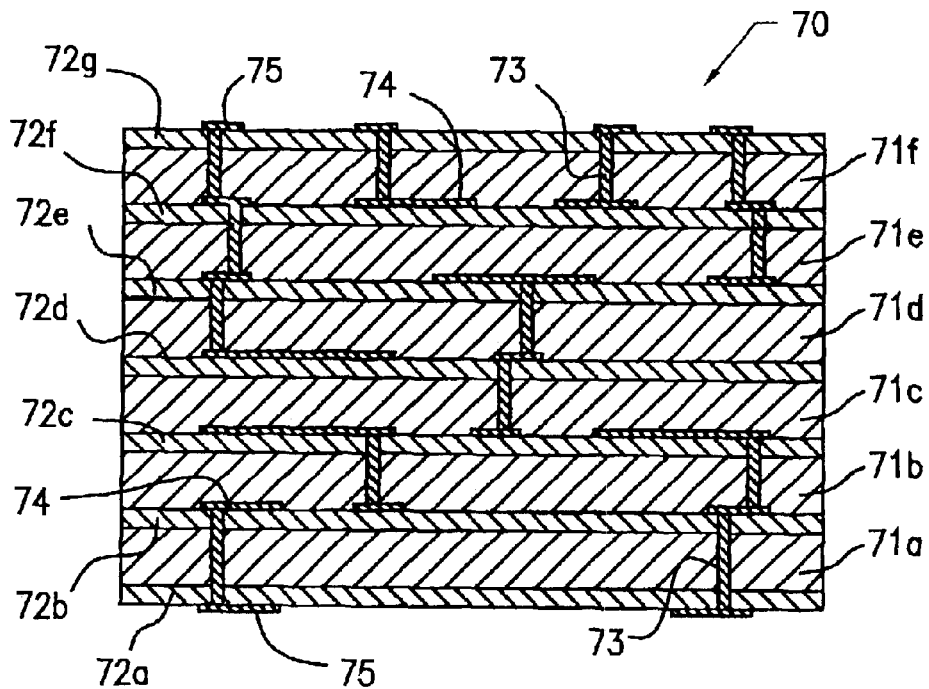
FIG. 18 is a schematic cross section of a ceramic multilayer substrate 70 according to a fourth embodiment of the present invention.

FIG. 18 shows a ceramic multilayer substrate of this embodiment. The ceramic multilayer substrate 70 has the structure in which glass-ceramic layers 71a through 71f and inorganic composition layers 72a through 72g are alternately laminated. Inside thereof, a capacitor pattern, a wiring pattern or the like are formed by viaholes 73 and internal conductors 74, and on the surface thereof, surface electrodes 75 are formed.

According to the method of producing a ceramic multilayer substrate of the present invention, a ceramic multilayer substrate having a layer configuration containing the inorganic composition layers 72a and 72g as the upper side and underside surface layers can be realized similarly to the ceramic multilayer substrate 20. When the thicknesses of the glass-ceramic layers 71a through 71f are the same, and the materials are the same as in the ceramic multilayer substrate 20, each thickness of the inorganic composition layers 72a and 72g as the upper side and underside surface layers is preferably about the half of that of the other inorganic composition layers 72b through 72f.

Fifth Embodiment

Figure 19:
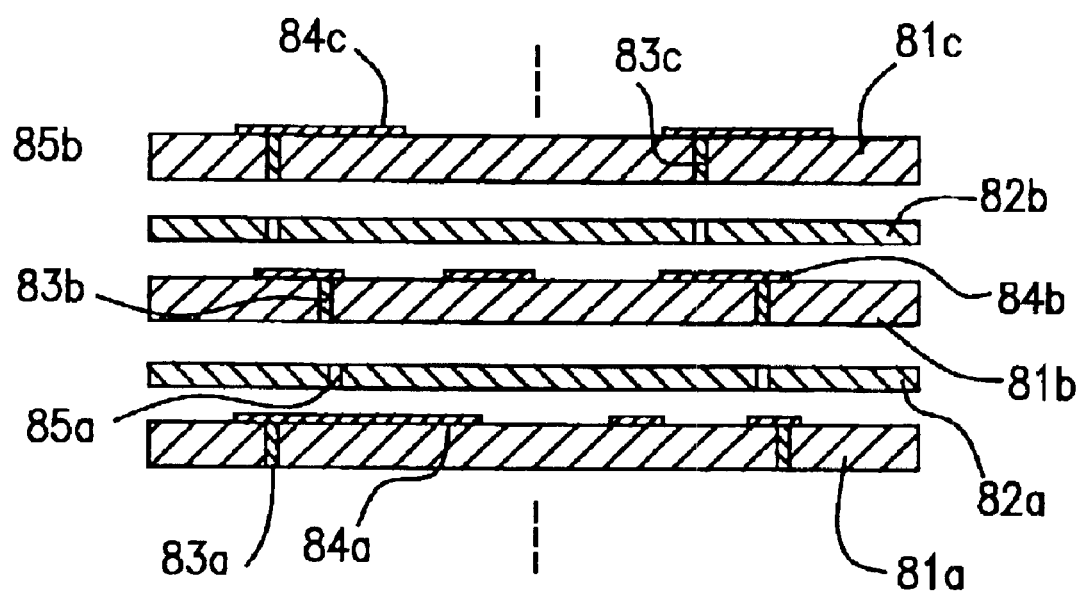
FIG. 19 is a schematic cross section showing a manufacturing process for a ceramic multilayer substrate according to a fifth embodiment of the present invention.

In this embodiment, as shown in FIG. 19, glass-ceramic green sheets 81a, 81b, 81c, provided with viaholes 83a, 83b, 83c, and conductor patterns 84a, 84b, 84c, and ceramic green sheets 82a, 82b, each containing the above-described inorganic composition as a major component are alternately laminated, and fired under the firing conditions for the glass-ceramic green sheets, whereby a ceramic multilayer substrate is produced.

Hereupon, perforations 85a, 85b are formed in the ceramic green sheets 82a, 82b containing the inorganic composition as a major component. No conductor material is filled into the perforations. That is, the thicknesses of the ceramic green sheets 82a, 82b are about 1–20 μm, or preferably 1–10 μm, and are extremely small as compared with those of the glass-ceramic green sheets 81a, 81b, 81c. Therefore, the viaholes 83a, 83b, 83c formed in the glass-ceramic green sheets 81a, 81b, 81c enter the perforations 85a, 85b upon pressure-bonded or firing, so that the conductor patterns on the respective glass-ceramic green sheets are connected to each other.

Hereinafter, the experimental results of the methods of producing a ceramic multilayer substrate according to the respective embodiments will be described.

TABLE 1 shows the first experimental results. The experiment was carried out to investigate how different the heat shrinkage ratios in the plane direction at firing of the laminates are, depending on the thicknesses of the inorganic composition layers. In this experiment, the compositions and the layer structures of the glass-ceramic green sheets and the inorganic composition layers are the same as described in the above first embodiment. The sintering temperatures of the glass-ceramic green sheets is 1000° C., and the sintering temperature of the ceramic green sheets is 1500° C. The thickness of the glass-ceramic green sheets is 100 μm. The number of layers is 10. The heat shrinkage ratios are calculated as follows:

TABLE 1

| thickness of inorganic composition layer (μm) | 0.0 | 0.5 | 1.0 | 5.0 | 10 | 15 | 20 | 25 |
|---|---|---|---|---|---|---|---|---|
| shrinkage ratio (%) | 83 | 95 | 97 | 98 | 98 | 98 | 98 | NG | heat shrinkage ratio (%) = 100 (longitudinal or lateral size of the bottom of the laminate after firing)/(longitudinal or lateral size of the bottom of the laminate before firing)

The designation "NG" signifies that peeling or cracking was generated, caused by the differences between the thermal expansion ratios of the ceramic green sheets and those of the glass-ceramic green sheets.

As seen in the experimental results, it can be suggested that the thicknesses of the inorganic composition layers (or the ceramic green sheets containing the inorganic composition as a major component) are preferably set to be in the range of about 1 to 20 μm.

TABLE 2 shows the second experimental results. This experiment was carried out to investigate how different the heat shrinkage ratios in the plane direction of the laminates caused when the glass-ceramic green sheets are fired depend on sintering temperatures. In this experiment, as the glass-ceramic green sheets, those having a sintering temperature of 1000° C. were used, and the heat shrinkage ratios were calculated.

TABLE 2

| temperature (° C.) | 700 | 800 | 900 | 925 | 950 | 975 | 1000 |
|---|---|---|---|---|---|---|---|
| shrinkage ratio (%) | 99.0 | 98.0 | 96.5 | 94.0 | 91.0 | 88.0 | 83.0 |

As seen in TABLE 2, for the glass-ceramic green sheets having a sintering temperature of 1000° C., the heat shrinkage ratios steeply decrease when the temperature becomes 900° C. or higher. The heat shrinkage of the glass-ceramic green sheets progresses steeply when the temperature is about 100° C. lower than the sintering temperature of 1000° C. or higher, that is, about 900° C. or higher. Accordingly the heat shrinkage in the plane direction of the glass-ceramic green sheets is inhibited if the ceramic green sheets are not heat shrunk in the range of 900° C. to 1000° C. Accordingly, it can be said that the object of the present invention can be achieved when the difference between the sintering temperatures of the glass-ceramic green sheets and the inorganic composition layers (or the ceramic green sheets containing the inorganic composition as a major component) is at least 100° C.

In the respective above-described embodiments, described is the case where the glass-ceramic green sheets each having the inorganic composition (ceramic green sheet) overlaid thereon are laminated in such a manner that the glass-ceramic green sheets and the inorganic compositions are alternately arranged to form the whole configuration of the laminate. However, for a part of the laminate, only the glass-ceramic green sheets, without the inorganic composition being interposed, may be laminated for the configuration. In brief, it is important to form such a layer configuration that the ceramic multilayer substrate is inhibited from shrinking in the plane direction with the warp and distortion of the substrate being reduced.

In the first and second embodiments, described is the case where a paste (slurry) is coated onto the front and back sides of the glass-ceramic green sheets and dried to form the inorganic composition layers. However, the glass-ceramic green sheets and the inorganic composition layers may be formed separately, and the glass-ceramic green sheets and the ceramic green sheets each containing the inorganic composition as a major component may be laminated to form a laminate. Likewise, a glass-ceramic green sheet having an inorganic composition on both faces but of different thicknesses can be employed as the undermost layer.

In the above-described respective embodiments, described is the case where conductor patterns and viaholes are formed in the respective layers constituting the laminate. A layer having no conductor pattern and or no viahole may be provided as a part of the laminate.

In the above-described embodiments, described is the case where a conductor is filled into the viaholes formed in the laminate. However, a conductor material may be provided only on the inner walls of the viaholes. Further, a cavity may be formed in the laminate described in the third embodiment according to the points of the above-described second embodiment.

While the invention has been particularly shown and described with reference to preferred embodiments thereof, it will be understood by those skilled in the art that the forgoing and other changes in form and details may be made therein without departing from the spirit of the invention.

What is claimed is:

1. A ceramic multilayer substrate comprising a laminate comprising a plurality of ceramic green sheets, and a layer of inorganic composition having a sintering temperature higher than that of the ceramic green sheets disposed between and bonding a pair of ceramic green sheets, wherein the compositions of the pair of ceramic green sheets and inorganic composition layer are such that the pair of ceramic sheets and inorganic composition layer therebetween remain bonded to each other after the laminate is fired.

2. A ceramic multilayer substrate according to claim 1, having a cavity extending from an outermost surface of the laminate to the layer of inorganic composition and exposing the layer of inorganic composition to the interior of the cavity.

3. A ceramic multilayer substrate according to claim 1, wherein one of the ceramic green sheets has a smaller thickness than each of the other ceramic green sheets and has said inorganic composition layer thereon and said one sheet is positioned so as to be an outermost layer of the laminate.

4. A ceramic multilayer substrate according to claim 1, wherein a plurality of ceramic green sheets having said inorganic composition layer thereon are positioned adjacent to one another to form said laminate.

5. A ceramic multilayer substrate according to claim 1, wherein two ceramic green sheets having a smaller thickness than each of the other ceramic green sheets are positioned so as to be the two outermost layers of the laminate.

6. A ceramic multilayer substrate according to claim 1, wherein the inorganic composition comprises alumina.

7. A ceramic multilayer substrate comprising:
a laminate comprising:
- a plurality of green ceramic sheets;
- a cavity having side surfaces and a bottom surface in the plurality of green ceramic sheets, and
- a layer of an inorganic composition having a sintering temperature higher than that of the green ceramic sheets, wherein the layer of inorganic composition is disposed between and bonded to a pair of the green ceramic sheets and the layer of inorganic composition is exposed at side surfaces and the bottom surface of the cavity, wherein the compositions of the pair of ceramic green sheets and inorganic composition layer are such that the pair of ceramic sheets and inorganic composition layer therebetween remain bonded to each other after the laminate is fired.

8. A ceramic multilayer substrate according to claim 7, wherein one of the ceramic green sheets has a smaller thickness than each of the other ceramic green sheets and has said inorganic composition layer thereon and said one sheet is positioned so as to be an outermost layer of the laminate.

9. A ceramic multilayer substrate according to claim 7, wherein a plurality of ceramic green sheets having said inorganic composition layer thereon are positioned adjacent to one another to form said laminate.

10. A ceramic multilayer substrate according to claim 7, wherein two ceramic green sheets having a smaller thickness than each of the other ceramic green sheets are positioned so as to be the two outermost layers of the laminate.

11. A ceramic multilayer substrate according to claim 7, wherein the inorganic composition comprises alumina.

12. A ceramic multilayer substrate according to claim 7, wherein the inorganic composition layer has a thickness of from about 1 to 20 $\mu$m.

13. A ceramic multilayer substrate according to claim 7, wherein the each individual inorganic composition layer has a thickness of from 1 to 10 $\mu$m.

14. A ceramic multilayer substrate according to claim 7, wherein the ceramic green sheet and inorganic composition are selected such that the difference between the sintering temperature of the ceramic green sheets and the sintering temperature of the inorganic composition is at least about 100° C.

15. A ceramic multilayer substrate according to claim 7, wherein each of the ceramic green sheets comprise ceramic, organic binder and plasticizer.

16. A ceramic multilayer substrate according to claim 15, wherein two ceramic green sheets having a smaller thickness than each of the other ceramic green sheets are positioned so as to be the two outermost layers of the laminate and wherein the ceramic green sheet and inorganic composition are selected such that the difference between the sintering temperature of the ceramic green sheets and the sintering temperature of the inorganic composition is at least about 100° C.

17. A ceramic multilayer substrate according to claim 16, wherein the inorganic composition comprises alumina and wherein the inorganic composition layer has a thickness of from about 1 to 20 $\mu$m.

18. A ceramic multilayer substrate comprising a fired laminate comprising a plurality of fired ceramic green sheets, and a layer of fired inorganic composition having a sintering temperature higher than that of the ceramic green sheets disposed between and bonded to a pair of fired ceramic green sheets.

19. A ceramic multilayer substrate according to claim 18 wherein the ceramic green sheets are glass-ceramic green sheets, and in which the layer of fired inorganic composition has been infiltrated by glass from the glass-ceramic green sheets and is strongly bonded thereto.

* * * * *